United States Patent [19]

Tsukada et al.

[11] 3,783,351

[45] Jan. 1, 1974

[54] SEMICONDUCTOR LASER DEVICE AND METHOD FOR MANUFACTURING THE SAME

[75] Inventors: Toshihisa Tsukada, Suginami-ku; Junichi Umeda, Kodaira; Masao Kawamura, Kokubunji, all of Japan

[73] Assignee: Hitachi, Ltd., Tokyo, Japan

[22] Filed: Sept. 7, 1971

[21] Appl. No.: 178,020

[30] Foreign Application Priority Data

Sept. 7, 1970 Japan .............................. 45/77766

[52] U.S. Cl. .. 317/235 R, 317/235 N, 317/235 AC, 317/234 Q, 331/94.5

[51] Int. Cl. .......................... H01l 15/00, H01l 3/20, H05b 33/00

[58] Field of Search ................. 317/235 N, 235 AC, 317/235 R

[56] References Cited

UNITED STATES PATENTS

| | | | |
|---|---|---|---|
| 3,163,562 | 12/1964 | Ross | 148/33.4 |
| 3,508,126 | 5/1970 | Newman | 317/235 |
| 3,617,929 | 11/1971 | Strack | 331/94.5 |
| 3,479,613 | 11/1969 | Rupprecht | 331/94.5 |

OTHER PUBLICATIONS

Electronics, March 16, 1970, pages 78–83.

Nelson et al., Applied Physics Letters, July 1, 1969, page 7.

*Primary Examiner*—Martin H. Edlow
*Attorney*—Craig & Antonelli

[57] ABSTRACT

A semiconductor laser device includes an n-type direct transition III-V Group compound semiconductor substrate, another n-type III-V Group compound semiconductor epitaxial growth layer formed on a principal plane of said semiconductor substrate and having a wider forbidden gap than the same, a p-type impurity diffusion layer which reaches said semiconductor substrate through a center portion of said epitaxial growth layer and extends to a pair of opposing end faces of the hetero-junction element, an electrode provided on the surface of said p-type impurity diffusion layer, and another electrode provided on the surface opposite thereto of said semiconductor substrate, a pair of opposing end faces of the hetero-junction element, being parallel to each other and mirror polished, thereby forming a laser resonator.

13 Claims, 8 Drawing Figures

INVENTORS
TOSHIHISA TSUKADA, JUNICHI UMEDA
MASAO KAWAMURA
BY Craig, Antonelli & Hill
ATTORNEYS

INVENTORS

TOSHIHISA TSUKADA, JUNICHI UMEDA,

MASAO KAWAMURA

BY Craig, Antonelli & Hill

ATTORNEYS

INVENTORS

TOSHIHISA TSUKADA, JUNICHI UMEDA,

MASAO KAWAMURA

BY Craig, Antonelli & Hill

ATTORNEYS

INVENTORS

TOSHIHISA TSUKADA, JUNICHI UMEDA, MASAO KAWAMURA

BY Craig, Antonelli & Hill

ATTORNEYS

SEMICONDUCTOR LASER DEVICE AND METHOD FOR MANUFACTURING THE SAME

BACKGROUND OF THE INVENTION

The present invention relates to a semiconductor laser device having hetero-structure and a process for producing the same.

DESCRIPTION OF THE PRIOR ART

Conventional semiconductor lasers have been constructed only from a p-n junction. For example an n-type substrate of GaAs ( doped with Te of $2 \times 10^{18}$ $cm^{-3}$) includes thermally diffused Zn as a different conduction type donor impurity to form a p-n junction in the n-type GaAs substrate, which is then cleft in a pair of opposing 110 planes to form a Fabry-Perot resonator by using the cleavage planes as reflection planes, and further the p and n conduction type layers of the substrate include, respectively, electrodes for injecting carriers.

As compared to such a simple p-n junction type semiconductor laser device, as described in "GaAs- $Ga_xAl_{1-x}As$ Heterostructure Injection Lasers which Exhibit Low Thresholds at Room Temperature," in Pages 150 to 163 Vol. 41 , " Journal of Applied Physics, " issued in January 1970 by American Institute of Physics, there is described a semiconductor laser device having hetero-structure which is formed by adding an epitaxial growth layer of p-type $Ga_xAl_{1-x}As$ to the ordinary p-n junction consisting of n-type GaAs and p-type GaAs. When a forward bias is applied to this device, electrons injected into the p-type GaAs layer from the n-type GaAs layer, due to a potential barrier existing between the p-type GaAs layer and the p-type $Ga_xAl_{1-x}As$ layer, cannot further enter the p-type $Ga_xAl_{1-x}As$ layer and are confined within the p-type GaAs layer. As a result, the recombination of electrons and positive holes is efficiently carried out in this region, thereby reducing the threshold current of the laser. In the above well-known example, it is described that the most efficient recombination light can be obtained when the thickness of the p-type GaAs layer is in the range of 2.0 to 2.5$\mu$ and $x$ in the $Ga_xAl_{1-x}As$ $(0<X<1)$ is equal to 0.5 , whereby the threshold current $J_{th}$ takes a minimum value of 8,000 A/$cm^2$. Since the threshold current density of the conventional simple p-n junction type laser device is in the order of 30,000 A/$cm^2$ , the above current value corresponds to about 20 percent thereof.

Also, in the above laser device of heterostructure, besides the confinement of electrons, the recombination light of electrons and positive holes is confined within the p-type GaAs layer because there is a several per cent difference in the refractive index for light of 9,000A between the n-type GaAs layer and the p-type GaAs layer and between the p-type $Ga_x Al_{1-x}As$ layer and the p-type GaAs. It is considered that the reduction of the threshold current $J_{th}$ is caused by these two factors. However, although the above laser device of heterostructure attains the confinement in the direction perpendicular to the junction plane, it does not attain the confinement of electrons and light in the direction parallel to the junction plane.

SUMMARY OF THE INVENTION

Therefore, the object of the present invention is to provide a semiconductor laser device having heterostructure which is constructed so as to enable the injected electrons and recombination light of injected electrons and positive holes to be efficiently confined.

It is another object of the present invention to provide a process for producing an improved semiconductor laser device of heterostructure.

In order to achieve the above objects of the present invention, an n-type $Ga_xAl_{1-x}As$ layer is epitaxially grown in the liquid or gas phase on an n-type GaAs substrate, and an $SiO_2$ film containing P is then provided on the n-type $Ga_xAl_{1-x}As$ layer. The $SiO_2$ film is then removed in the form of a band by means of a photoresist at the center portion of the substrate so as to reach the opposed ends of the hetero-junction thus formed. Then, Zn is thermally diffused through the portion where the $SiO_2$ film has been removed as described above. The diffusion is carried out for a period of time and at a temperature ( e.g. 850°C ) sufficient to produce a p-type GaAs layer having an adequate thickness in the n-type GaAs substrate. Then, electrodes are attached by ohmic contact to the p-type $Ga_xAl_{1-x}As$ layer and the n-type GaAs layer, and a pair of opposing planes are cleft to form reflective planes, thereby producing a semiconductor laser device.

The semiconductor laser device thus constructed can obtain the two dimensional confinement of injected electrons and recombination light because of the surrounded structure of the p-type GaAs.

The above description has been related only to a case wherein the substrate is GaAs and the epitaxial growth layer is GaAl As, but any of III-V Group compound semiconductors which generate light by the injection of minority carriers may be used as a substrate, and any other III-V Group compound semiconductors which have wider forbidden gaps than the above-mentioned III-V Group compound semiconductors may be used as an epitaxial growth layer.

The features and advantages of the present invention will now be described in conjunction with the appended drawings and examples, but it is to be understood that these are only illustrative and various alterations can be conceived without departing from the spirit of the present invention.

EXAMPLE 1

Figure 1:
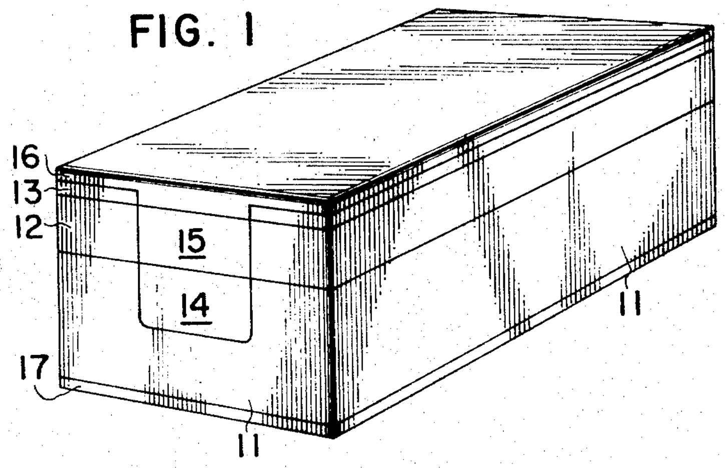
FIG. 1 is a perspective view illustrating the construction of the semiconductor laser device of the present invention.

With reference to FIG. 1, on a (100) n-GaAs substrate 11 containing Te as an impurity at a concentration of $2 \times 10^{18}$ $cm^{-3}$ was grown an n-$Ga_xAl_{1-x}As$ layer 12 having a thickness of 2$\mu$. The solution employed therefor consisted of Ga 91 atomic %, As 8 atomic % and Al 1 atomic % and 60 mg of Te as an impurity was dissolved per 10 g of Ga. The temperature was lowered from 990°C to 988°C at a rate of 1°C/min.

At the interface with the GaAs, the value of x of the $Ga_xAl_{1-x}$ As was $0.5>x>0.3$ and the carrier concentration was $2 \times 10^{18} cm^{-3}$.

A film of $SiO_2$ 13 containing $P_2O_5$ was provided on this crystal and a groove having a width of 2$\mu$ was formed by removing $SiO_2$ by a photoresist technique to perform selective diffusion. The diffusion was carried out by a closed tube method using $ZnAs_2$ as a diffusion source. Under the diffusion conditions of 800°C and 25 min. a p-type GaAs layer 14 having a thickness of 2$\mu$ (microns) was obtained. In FIG. 1, 15 is a p-type $Ga_xAl_{1-x}As$ diffusion layer, 16 a positive electrode and 17 a negative electrode.

How the confinement of the injected electrons is attained will now be described.

Figure 2:
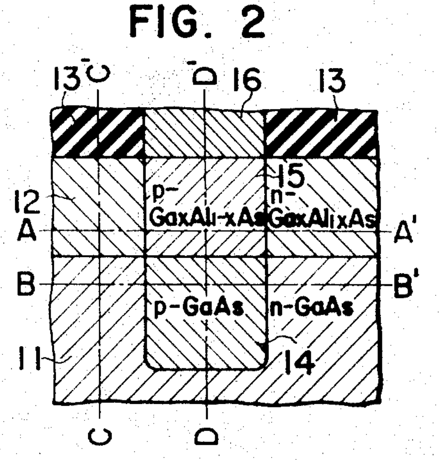
FIG. 2 is a partially enlarged cross-sectional view of the semiconductor laser device of FIG. 1.

FIG. 2 is an enlarged view of the vicinity of the junction of the p-type $Ga_xAl_{1-x}As$ and GaAs of FIG. 1, and FIGS. *3a*, *3b*, *3c* and *3d* show the energy diagrams in the cross sections taken along the lines A—A', B—B', C—C' and D—D', respectively, of this device.

Figure 3A:
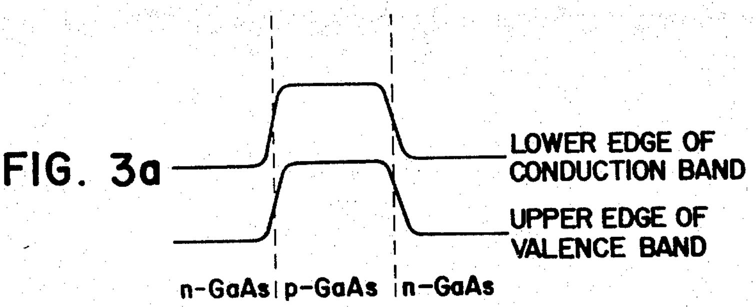
FIGS. 3*a*, 3*b*, 3*c* and 3*d* indicate energy states in the cross sections taken along the lines A—A', B—B', C—C' and D—D', respectively of FIG. 2.
Figure 3B:
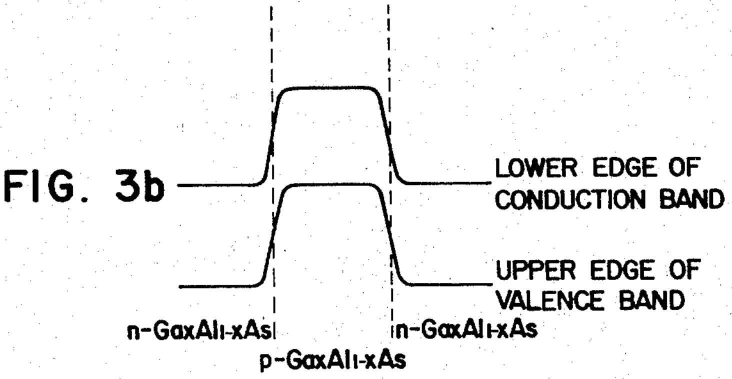
Figure 3C:
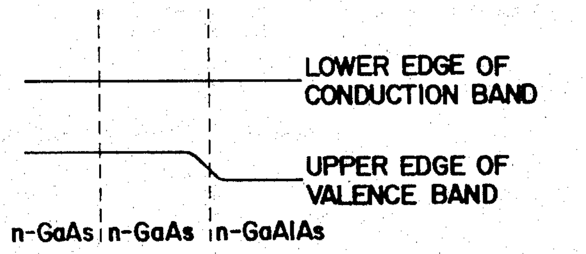

FIGS. 3a-3b are the energy diagrams in the direction of lines A—A' and B—B', respectively, of FIG. 2, i.e., energy diagrams of the n-p-n structure of GaAs and $Ga_xAl_{1-x}As$.

FIG. *3c* is the energy diagram in the direction of line C—C' of FIG. 2, i.e., energy diagram of the junction of the n-type GaAs and n-type $Ga_xAl_{1-x}As$.

Figure 3D:
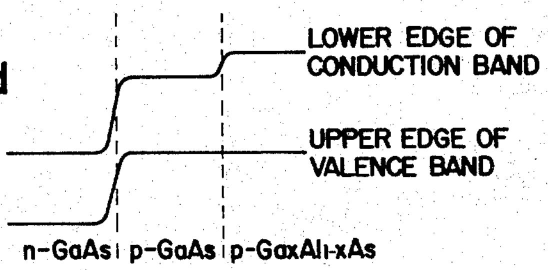

FIG. 3d is an energy diagram of the n-type GaAs, p-type GaAs and p-type $Ga_xAl_{1-x}As$ and shows the energy state at the interface of the p-n junction and heterostructure. As is clear from FIG. *3d*, the heterostructure forms a potential barrier to electrons. As seen in the direction of D—D', the energy state is the same as in the conventional device, and the energy state in the case of forward bias is also the same as in the conventional device.

Figure 4:
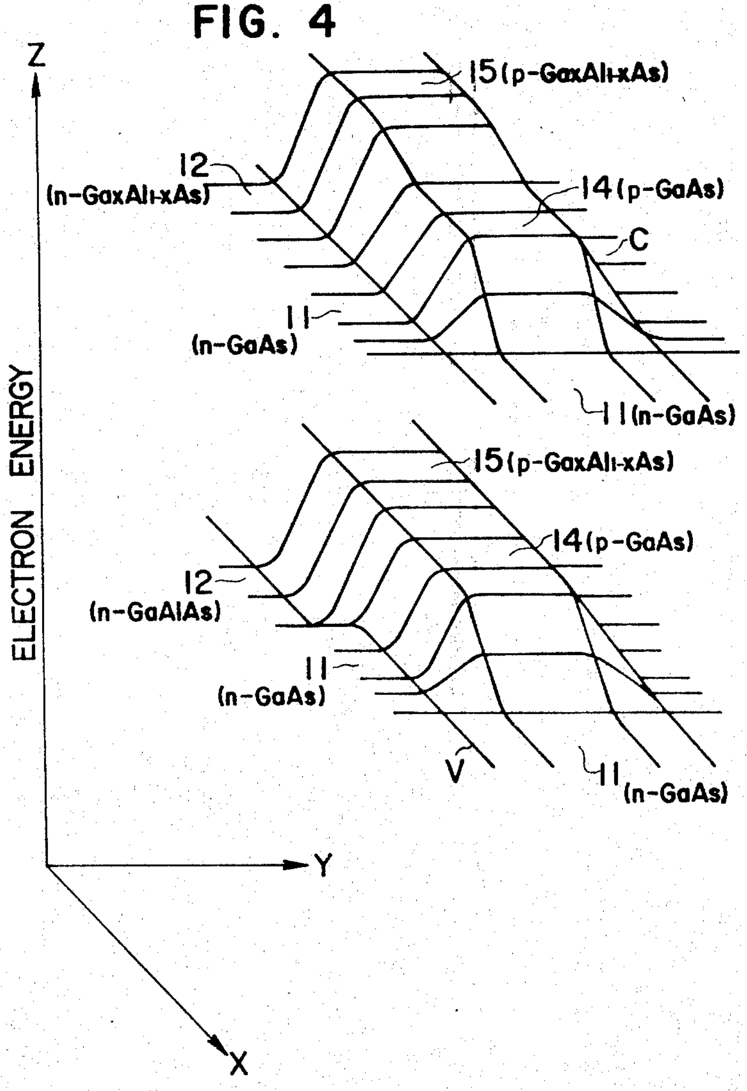
FIG. 4 is an energy state diagram in case of zero bias indicating in the two dimensions the energy state of the construction of FIG. 2.
Figure 5:
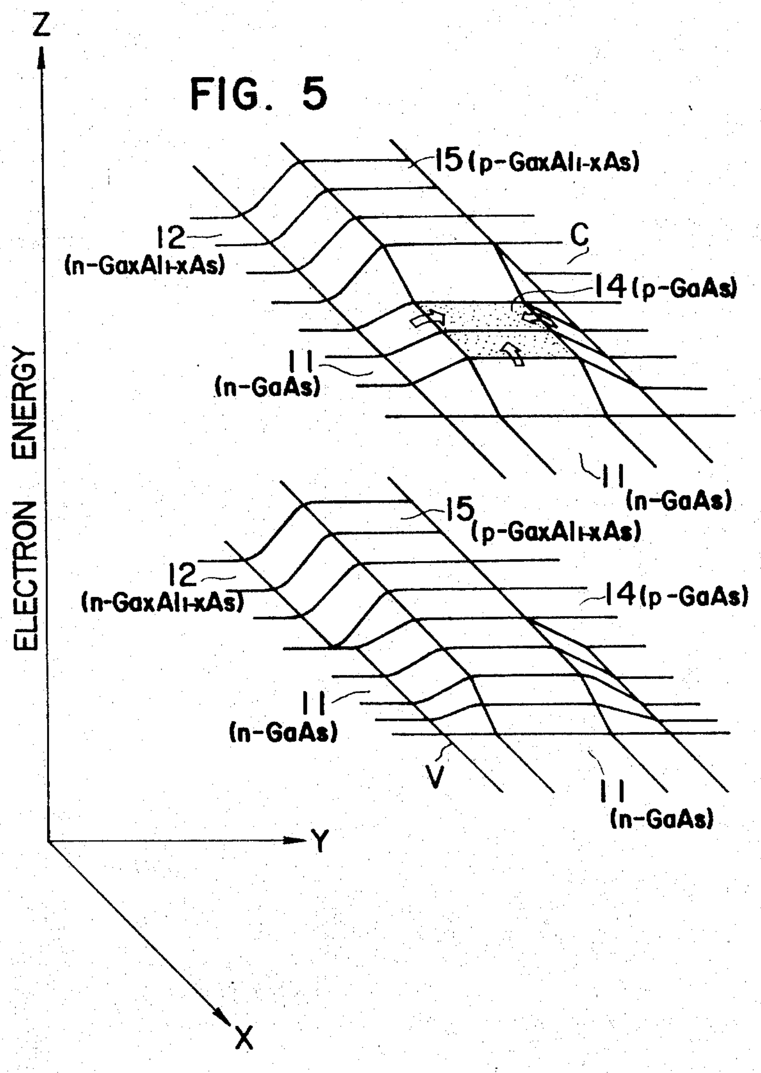
FIG. 5 is an energy diagram in case of forward bias of the construction of FIG. 2.

FIG. 4 is a two dimensional energy diagram of the semiconductor laser device of FIG. 2, wherein the coordinates X, Y and Z, represent the position in the direction parallel to DD' in FIG. 2, the position in the direction parallel to AA' in FIG. 2, and the potential energy of electrons, respectively, V is the upper edge of valence band and C the lower edge of conduction band. This is a diagram in case of zero bias, and in case of forward bias applied, V and C become as indicated in FIG. 5. The thick arrows in the lower edge of conduction band C of FIG. 5 indicate how the carriers are injected. As opposed to the conventional device, the injection of carriers takes place from three directions, thereby facilitating the attainment of inversion distribution necessary for the laser function. A direction other than the three directions of the carrier injection lies near the p-type $Ga_xAl_{1-x}As$ 15 and due to this barrier of p-type $Ga_xAl_{1-x}As$, electrons cannot escape in this direction. When a forward bias is applied to the p-n junction, the p-n junction of GaAs of $Ga_xAl_{1-x}As$ is also biased in a forward direction to some extent, but since the band gap energy of $Ga_xAl_{1-x}As$ is larger than that of GaAs, the current flowing through the p-n junction of $Ga_xAl_{1-x}As$ may be almost ignored.

Since most of the current flows through the radiation recombination in the p-type GaAs region, the efficienty of electricity-light conversion is remarkably high. Accordingly, the threshold current density of laser can be reduced as compared to that of the laser conventional construction.

On the other hand, in the production of the semiconductor laser device construction of the present invention wherein an n-type $Ga_xAl_{1-x}As$ layer is grown on an n-type GaAs substrate and a selective diffusion of Zn thereto is performed, it is not preferrable to use merely $SiO_2$ as a mask for this selective diffusion because Zn passed through the $SiO_2$ film. In order to avoid this, $SiO_2$ containing $P_2O_5$ or $Si_3N_4 + SiO_2$ is used. However, the insulating function of these materials is not strong enough to perfectly block Zn so that a thin p-type layer is also formed under these insulators. However, unless this p-type layer reaches the GaAs layer, it has no adverse effects. That is because even where a sufficiently high forward bias is applied to the p-n junction of GaAs, the p-n junction of $Ga_xAl_{1-x}As$ is biased only weakly in the forward direction and the current flowing therethrough may be almost ignored.

After the selective diffusion, an ohmic contact is provided on p-type $Ga_xAl_{1-x}As$ by vapor deposition.

A difference of refractive index is also produced in the transverse direction B—B' ( FIG. *3a* ) by selective diffusion, thereby enabling a remarkable confinement of light waves. This means that an additional current due to the loss of light in the transverse direction is not required as compared to the conventional laser. Accordingly, the consumption of electric power is low, which is advantageous concerning heat dissipation. Although with a laser having band-like electrodes, the preferred width thereof is 12.5$\mu$, the construction of the present invention can decrease the electrode width to an order of 2 to 3 $\mu$ and attain an extensive reduction of the consumption of electric power by ¼ to 1/6.

EXAMPLE 2

On a (100) plane of an n-type GaAs substrate containing Te as impurity at a concentration of $2 \times 10^{18} cm^{-3}$ was epitaxially grown a GaAsP layer having a thickness of 2$\mu$. The epitaxial growth was attained as follows: A Ga source and said substrate were charged in a opened reaction tube to heat the Ga source to 900°C and the substrate to 810°C, and a gas mixture of $AsH_3$ and $PH_3$ was introduced into the tube from the other end thereof at a flow rate of 80 $\mu$ mol/min and at the same time, HCl was introduced into the tube from another gas source at a flow rate of 150 $\mu$ mol/-min, whereby the ratio of $AsH_3$ to $PH_3$ was maintained at 0.65/0.35 and said reaction gases were introduced at a total flow rate of 220 cc/min using $H_2$ as carrier gas, and, on the other hand, $H_2Se$ gas as impurity doping agent was introduced into said reaction tube at a flow rate of 20cc/min to cause reaction, thereby an epitaxial layer of $GaAS_{0.6}P_{0.4}$ being produced on the n-type GaAs substrate. ( An epitaxial layer having a thickness of 2$\mu$ was obtained in a growth time of 15 minutes ).

Selective diffusion was carried out in the substrate having the epitaxial growth layer thus produced under the same conditions as the Example 1. The diffusion was performed at 300°C for 20 minutes by using a closed tube and $ZnAs_2$ to obtain the p-type GaAs layer having a thickness of 2$\mu$.

A laser diode using this was produced, the threshold-current density of which was reduced by ½ as compared to one with no transverse confinement.

Although in the above Examples, there has been described the production of a semiconductor laser device of the present invention, whereby a GaAs substrate having thereon an epitaxial growth layer of GaAsP or GaAlAs was used as starting material, a III-V Group compound semiconductor substrate such as InSb, CdS, ZnS, besides the GaAs substrate, having thereon these multi-element mixed crystal III-V compound semiconductor epitaxial growth layer can be used to produce the semiconductor laser.

As described above, the present invention can be summarized as comprising:

*a.* forming a heterojunction of an n-type direct transition III-V Group compound semiconductor ( including a multi-element mixed crystal system ) and an n-type III-V Group compound semiconductor having a wider forbidden gap than the first mentioned semiconductor ( including multi-element mixed crystal system ),

*b.* forming a mask for selective diffusion of an impurity on the principal plane of the n-type III-V Group compound semiconductor having the wider forbidden gap of said hetero-junction elements,

*c.* removing said mask in the center portion thereof extending and perpendicular to opposing end faces of said element and diffusing p-type donor impurity to a depth reaching in part said n-type direct transistion III-V Group compound semiconductor layer ( 15 and 14), d. providing electrodes(16 and 17 ) for injecting electric power on the principal planes, respectively, of said p-type III-V Group compound semiconductor and n-type direct transition III-V Group compound semiconductor, and e. cleaving perpendicular to the hetero-junction plane.

We claim:

1. A semiconductor laser device comprising a semiconductor crystal having therein a hetero-junction plane consisting of an n-type direct transistion III-V Group compound semiconductor substrate and n-type III-V Group compound epitaxial growth layer having a wider forbidden gap than said III-V Group compound semiconductor substrate, said semiconductor crystal having a pair of opposing end faces which are substantially parallel to each other and perpendicular to said hetero-junction plane, a p-type diffusion layer provided within said semiconductor crystal from one surface thereof so as to substantially extend to said pair of end faces in the direction perpendicular thereto and so as not to extend to a pair of faces perpendicular to said end faces in the direction parallel thereto, extending into said n-type direct transition III-V Group compound semiconductor substrate through said n-type III-V Group compound epitaxial layer, a positive electrode provided on said diffusion layer surface, and a negative electrode provided on the surface having no diffusion layer provided of said n-type direct transition III-V Group compound semiconductor substrate.

2. A semiconductor laser device according to claim 1, wherein said n-type direct transition III-V compound semiconductor is GaAs and said III-V Group compound semiconductor having a wider forbidden gap is $Ga_xAl_{1-x}As$ where $0.5 > x > 0.3$.

3. A semiconductor laser device according to claim 1, wherein said n-type direct transition III-V Group compound semiconductor is GaAs and said III-V Group compound semiconductor having a wider forbidden gap is GaAsP.

4. A semiconductor laser device according to claim 1, wherein the p-type diffusion layer provided within said n-type direct transition III-V Group compound semiconductor has a thickness not exceeding $2\mu$.

5. A semiconductor laser device according to claim 1, further including an impurity selective diffusion mask containing phosphosilicate glass provided on the surface of said substrate on which said positive electrode is provided.

6. A semiconductor laser device comprising:

a semiconductor crystal having therein a hetero-junction plane formed of a first conductivity type direct transition III-V Group compound semiconductor substrate and a first conductivity type III-V Group compound epitaxial growth layer having a wider forbidden gap in its electron energy transfer characteristic than said substrate, said crystal having a first pair of substantially parallel opposing end faces each of which is perpendicular to said hetero-junction plane;

a diffusion layer of a second conductivity type semiconductor material opposite to said first conductivity type provided within said crystal from a first surface thereof and being bounded by said pair of end faces in a first direction parallel to said first surface of said crystal, while being bounded by first and second portions of said substrate and said epitaxial growth layer in a second direction parallel to said first surface of said crystal and perpendicular to said first direction, said diffusion layer extending into said substrate through said epitaxial layer;

a first electrode provided on said first surface of said crystal and contacting said diffusion layer;

a second electrode provided on a second surface of said crystal parallel to said first surface and spaced from said diffusion layer provided in said crystal.

7. A semiconductor laser device according to claim 6, further including a layer of phosphosilicate glass formed on said first surface of said crystal adjacent said first electrode.

8. A semiconductor laser device according to claim 6, wherein said first conductivity type compound is an n-type compound and wherein said second conductivity type layer is a p-type layer.

9. A semiconductor laser device according to claim 8, wherein said n-type direct transition III-V compound semiconductor is GaAs and said III-V Group compound semiconductor having said wider forbidden gap is $Ga_xAl_{1-x}As$, where $0.5 > x > 0.3$.

10. A semiconductor laser device according to claim 8, wherein said n-type direct transition III-V Group compound semiconductor is GaAs and said III-V Group compound semiconductor having said wider forbidden gap is GaAsP.

11. A semiconductor laser device according to claim 8, wherein said p-type diffusion layer provided within said n-type direct transition III-V Group compound semiconductor has a thickness not exceeding 2 microns.

12. A semiconductor laser device according to claim 1, wherein the width of said laser device is smaller than 3 microns.

13. A semiconductor laser device comprising:

an element body for producing coherent light upon the application of a prescribed voltage thereacross, said element body comprising a semiconductor crystal having a hetero-junction plane therein consisting of an-type direct transition III-V group compound semiconductor substrate and an n-type III-V group compound epitaxial growth layer having a wider forbidden gap than said III-V group compound semiconductor substrate, said crystal body having means for forming an optical laser resonator cavity therein comprising a pair of opposing end faces of said semiconductor crystal which are substantially parallel to each other and perpendicular to said hetero-junction plane, and means for generating light by the injection of carriers therein and for confining both electrons and light in a prescribed direction comprising a p-type diffusion layer provided within said semiconductor crystal from one surface thereof, so as to substantially extend to said pair of end faces in a direction perpendicular thereto and so as to not extend to a pair of faces perpendicular to said end faces in the direction parallel thereto, extending into said n-type direct transition III-V group compound semiconductor substrate through said n-type III-V compound epitaxial growth layer ;and means for coupling said prescribed voltage to said element body for initiating the generation of laser emission therefrom comprising a positive electrode provided on said diffusion layer surface, and a negative electrode provided on the surface, having no diffusion layer provided, of said n-type direct transistion III-V group compound semiconductor substrate.

* * * * *